United States Patent [19]

Nakao

[11] Patent Number: 5,206,542
[45] Date of Patent: Apr. 27, 1993

[54] COMPARATOR HAVING A REDUCED NUMBER OF ELEMENTS

[75] Inventor: Satoshi Nakao, Tokyo, Japan

[73] Assignee: Kabushiki Kaisha Toshiba, Kawasaki, Japan

[21] Appl. No.: 700,415

[22] Filed: May 15, 1991

[30] Foreign Application Priority Data

May 17, 1990 [JP] Japan .................. 2-127471

[51] Int. Cl.⁵ .......................... H03K 5/153
[52] U.S. Cl. .................. 307/350; 307/354; 307/365; 307/359
[58] Field of Search ........... 307/350, 354, 356, 359

[56] References Cited

U.S. PATENT DOCUMENTS

| | | | |
|---|---|---|---|
| 3,733,498 | 5/1973 | Watson | 307/350 |
| 4,115,711 | 9/1978 | Moussie | 307/350 |
| 4,385,243 | 5/1983 | Suzuki | 307/350 |
| 4,613,768 | 9/1986 | Pommer, II | 307/350 |
| 4,701,639 | 10/1987 | Stanojevic | 307/350 |
| 5,057,709 | 10/1991 | Petty et al. | 307/350 |

Primary Examiner—Bruce Y. Arnold
Assistant Examiner—Evelyn A. Lester
Attorney, Agent, or Firm—Finnegan, Henderson, Farabow, Garrett and Dunner

[57] ABSTRACT

In a comparator according to this invention, a first transistor of a first polarity and a second transistor of a second polarity are connected to each other between a first and second potentials so as to provide positive feedback. The control terminal of a third transistor of the second polarity is connected to one end of the current path of the second transistor and at the midpoint of the positive feed back path between the first and second transistors. A reference voltage is supplied to the base of the first transistor from a voltage dividing resistor circuit that varies the reference voltage according to the conducting state of either the second transistor or the third transistor. The input signal is received at one end of the current path of the first transistor, while the output signal appears at one end of the current path of the third transistor.

25 Claims, 5 Drawing Sheets

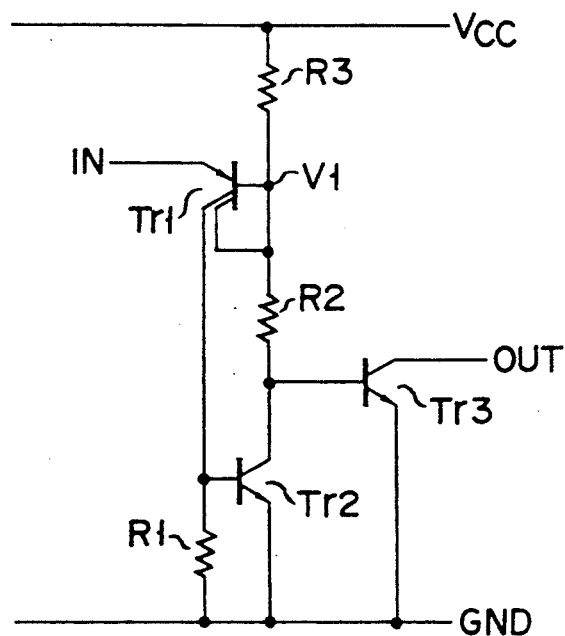
F I G. 2

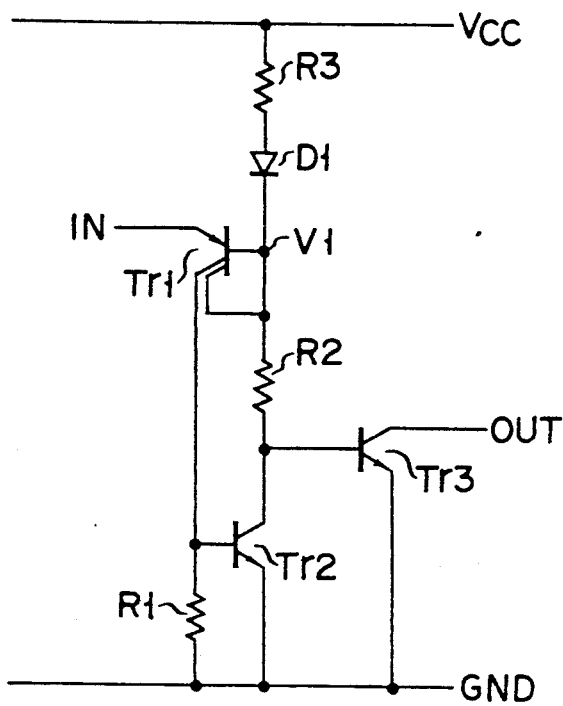
F I G. 3
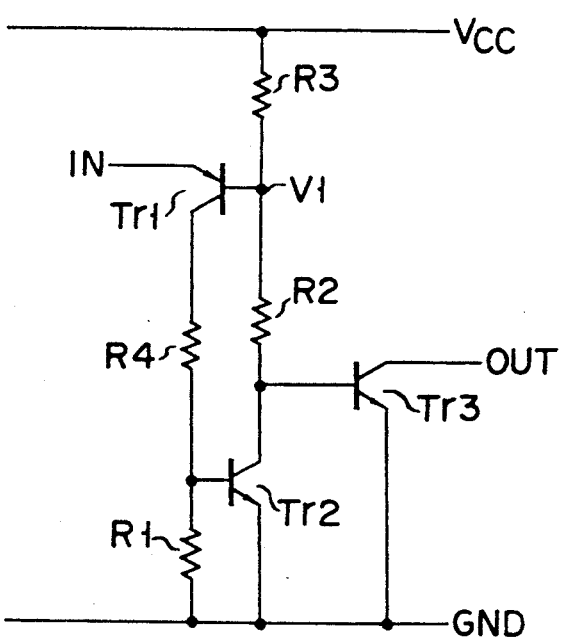
F I G. 4

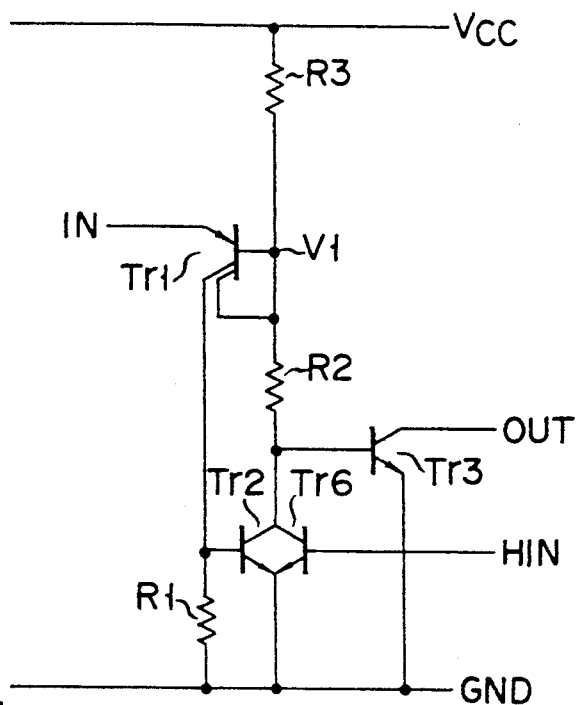
F I G. 7
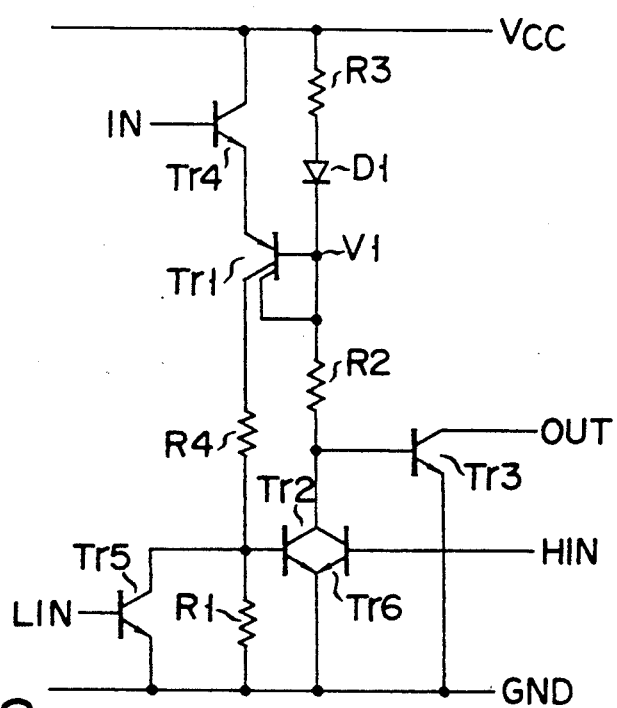
F I G. 8

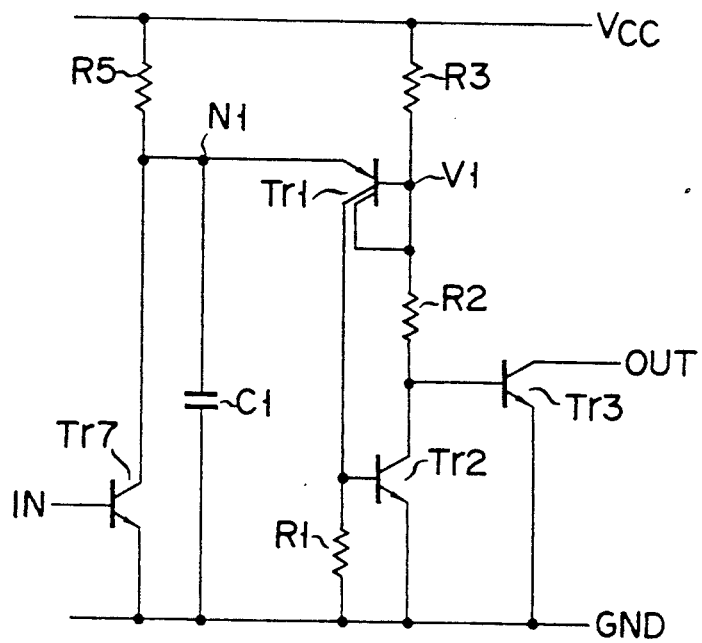
F I G. 9
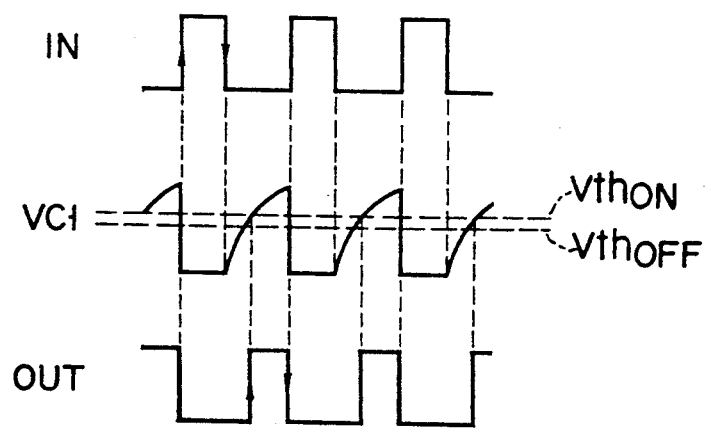
F I G. 10

COMPARATOR HAVING A REDUCED NUMBER OF ELEMENTS

BACKGROUND OF THE INVENTION

1. Field of the Invention

This invention relates to a comparator circuit, and more particularly to a comparator circuit with a hysteresis that requires relatively less strict accuracy.

2. Description of the Related Art

In a case where a comparator is installed in the electric circuitry in a machine or a system designed to achieve a specific function, the comparator can be forced to receive a signal on which noise has been superposed due to external factors or the intervening circuitry it has passed through. To prevent the comparator from responding to such unwanted noise, the comparator is constructed so that the output $V_{out}$ may have a hysteresis (a dead band) with respect to the input $V_{in}$. With this construction, as the input $V_{in}$ increases, the output $V_{out}$ starts to rise at the ON level of the input and remains stable as long as there is no noise large enough to cause the input to decrease to the OFF level. Although not shown, for the decreasing input $V_{in}$, the output $V_{out}$ begins to fall at the OFF level and remains stable insofar as there is no noise large enough to cause the input to increase to the ON level.

Conventionally, such a comparator with a hysteresis comprises a differential transistor pair and a constant current source circuit connected to both the current output terminals of the differential transistor pair. The control terminal of one transistor of the pair receives the signal input, whereas the control terminal of the other transistor of the pair receives the input for a reference voltage. This reference voltage is adjusted by an additional circuit that changes the voltage according to the output signal voltage from the differential transistor pair, with the result that the threshold value for each of the rising and falling of the output signal varies accordingly.

Such a comparator, however, has the disadvantage of requiring so many elements that it is less suitable for an integrated circuit, although it has a hysteresis requiring less strict accuracy of the threshold value. That is, a comparator with the above arrangement needs many of elements to constitute the differential transistor pair, the constant current source circuit, and associated circuits, which results in an increase in the number of elements used in the reference-voltage adjusting circuit. This leads to a rise in production costs and the difficulty in providing a compact design.

SUMMARY OF THE INVENTION

Accordingly, the object of the present invention is to provide a comparator with a simplified circuit ensuring the essential function, which contributes toward reducing the chip size.

The foregoing object is accomplished by a comparator circuit according to the present invention, comprising:

a first transistor of a first polarity and a second transistor of a second polarity, one end of the current path of each of the first and second transistors being connected to each other's control terminal between a first voltage and a second voltage so as to provide positive feedback;

a third transistor of the second polarity, whose control terminal is connected to one end of the current path of the second transistor and at the midpoint of the positive feedback path between the first and second transistors;

a reference voltage supply circuit for supplying a reference voltage to the base of the first transistor, the reference voltage varying according to the conducting state of either the second transistor or the third transistor;

input means for supplying a signal to one end of the current path of the first transistor; and output means for outputting a signal at one end of the current path of the third transistor.

With this configuration, circuit means composed of the first and second transistors of different polarity connected to each other so as to provide positive feedback contributes to a significant reduction in the number of elements used.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram for a first embodiment of the present invention;

FIG. 3 is a circuit diagram for a second embodiment of the present invention;

FIG. 4 is a circuit diagram for a third embodiment of the present invention;

FIG. 7 is a circuit diagram for a sixth embodiment of the present invention;

FIG. 8 is a circuit diagram for a seventh embodiment of the present invention;

FIG. 9 is a circuit diagram for an application of the present invention; and

FIG. 10 is a waveform diagram illustrating the operation of each section of the circuit in FIG. 9.

DETAILED DESCRIPTION OF THE PREFERRED EMBODIMENTS

Figure 1:
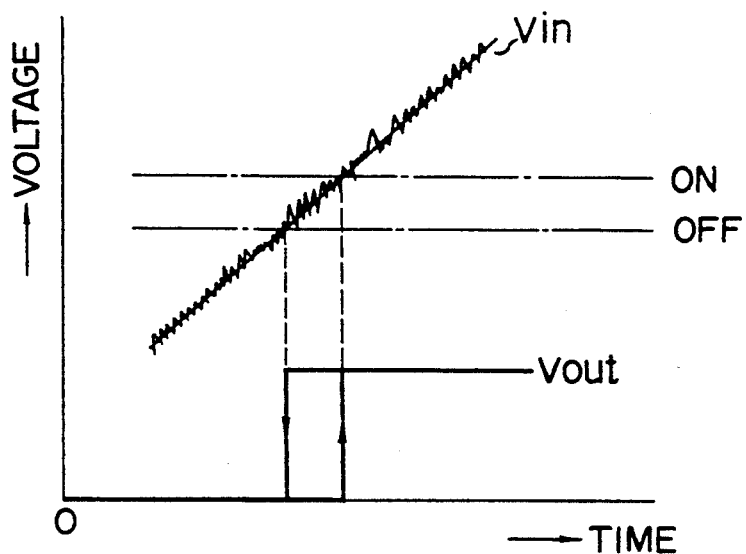
FIG. 1 shows a voltage-time diagram for explaining the operation of a comparator with a hysteresis.

The present invention will be explained hereinafter by means of embodiments, referring to the accompanying drawings.

FIG. 2 is a circuit diagram for a comparator according to a first embodiment of the present invention. A p-n-p transistor Tr1, which receives the input signal IN at the emitter, has a multicollector construction in which a first collector is connected to the ground voltage GND via a resistor R1 and a second collector is connected to both one end of a resistor R2 and its own base. The transistor Tr1's base is also connected to the supply voltage $V_{CC}$ via a resistor R3. The other end of the resistor R2 is connected to both the collector of an n-p-n transistor Tr2 and the base of an n-p-n transistor Tr3. The base of the transistor Tr2 is connected to the connecting point of the transistor Tr1's collector and the resistor R1, while its emitter is connected to the GND. The emitter of the transistor Tr3 is connected to the GND, whereas its collector is the output terminal for the output signal OUT. The reference voltage V1 is the base voltage of the transistor Tr1, which is determined by the voltage dividing ratio given by resistors R2 and R3. The operation of a circuit constructed as described above will now be explained.

When the input signal IN is higher in voltage than V1 and the voltage difference between them is larger than the base-emitter voltage $V_{BE}1$ of the transistor Tr1, the transistor Tr1 will be on. This makes the transistor Tr2 on and the transistor Tr3 off. As a result, positive feedback is applied to the transistor Tr1 connected to the collector of the transistor Tr2 via the resistor R2. More specifically, when the transistor Tr1 is first off, then the transistor Tr3 will be on, which causes the voltage difference between the supply voltage $V_{CC}$ and the junction voltage $V_{BE}3$ (e.g., 0.7V) of the transistor Tr3 to be divided at the voltage dividing ratio given by the resistors R3 to R2. The resulting voltage determines the reference voltage V1. Then, when the transistor Tr2 is on, the voltage difference between the supply voltage VCC and nearly the GND is divided at the voltage dividing ratio given by the resistors R3 and R2 and the resulting voltage determines the reference voltage V1.

When the input signal IN is lower in voltage than V1 and the voltage difference between them is smaller than the base-emitter voltage $V_{BE}1$ of the transistor Tr1, the transistor Tr1 will be off, which causes the transistor Tr2 to turn off and the transistor Tr3 to turn on.

With the above arrangement, the threshold voltage $Vth_{OFF}$ for the input signal IN required for the transistor Tr3 producing the output OUT to turn off is expressed as:

$$Vth_{OFF} = \frac{R2}{(R2 + R3)} \cdot V_{CC} + \frac{R3}{(R2 + R3)} \cdot V_{BE}3 + V_{BE}1 \quad (1)$$

The threshold voltage $Vth_{OUT}$ for the input signal IN required for the transistor Tr3 to turn on is expressed as:

$$Vth_{ON} = \frac{R2}{(R2 + R3)} \cdot V_{CC} + V_{BE}1 \quad (2)$$

Consequently, using as few as six elements, a comparator with a hysteresis (a dead band) can be constructed, the amount of the hysteresis being given in the above equation (1) by the term:

$$\frac{R3}{(R2 + R3)} \cdot V_{BE}3$$

FIG. 3 shows a second embodiment of the present invention. In this embodiment, an additional diode D1 has the anode and cathode connected to the resistor R3 and the base of the transistor Tr1, respectively, in FIG. 2. With this arrangement, the rising voltage $V_F$ of the diode D1 functions in such a manner as to cancel variations in the base-emitter voltage $V_{BE}1$ with temperature.

FIG. 4 illustrates a third embodiment of the present invention. In this embodiment, a single-collector transistor is used in place of the multicollector transistor Tr1 in FIG. 2. A resistor R4 is connected between the collector of the single-collector transistor Tr1 and the base of the transistor Tr2. With this arrangement, the resistor R4 functions in such a manner as to limit the base current to the transistor Tr2 to prevent overcurrent.

Figure 5:
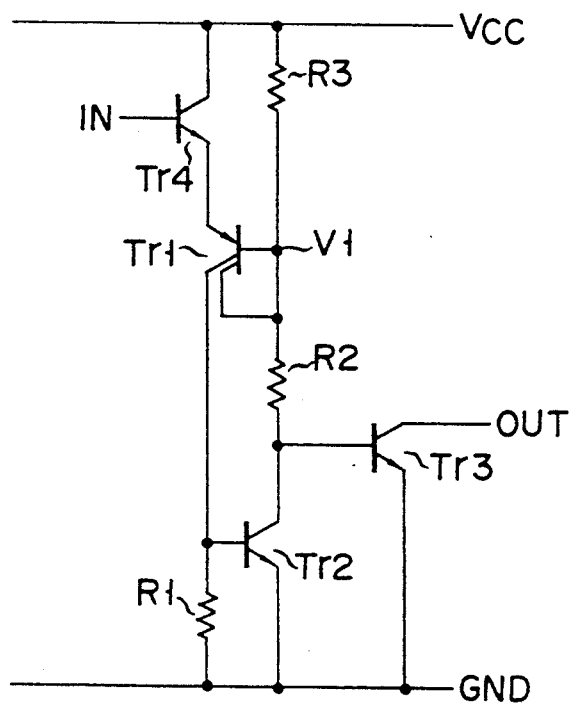
FIG. 5 is a circuit diagram for a fourth embodiment of the present invention.

FIG. 5 is a circuit diagram for a fourth embodiment of the present invention. In this embodiment, an additional n-p-n transistor Tr4 has its collector and emitter connected to VCC and the emitter of the input signal-receiving p-n-p transistor Tr1, respectively, in FIG. 2, with the base of transistor Tr4 receiving the input signal IN instead. Use of the emitter-follower transistor Tr4 as the input transistor raises the input impedance compared with the circuit in FIG. 1) resulting in the decreased input current.

Figure 6:
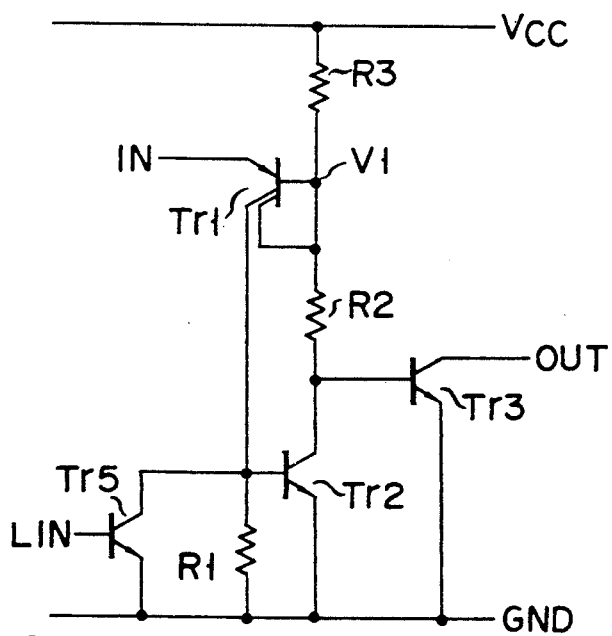
FIG. 6 is a circuit diagram for a fifth embodiment of the present invention.

FIG. 6 is a circuit diagram for a fifth embodiment of the present invention. In this embodiment, an additional n-p-n transistor Tr5 has its emitter and collector connected to the GND and the base of the transistor Tr2, respectively, in FIG. 2, with the base of transistor Tr5 receiving a control signal LIN. Putting the control signal LIN in the high level causes the transistor Tr3 to be on, irrespective of the level of the input signal IN.

FIG. 7 is a circuit diagram for a sixth embodiment of the present invention. In this embodiment, an additional n-p-n transistor Tr6 has its emitter and collector connected to the GND and the base of the transistor Tr3 respectively in FIG. 2, with the base of transistor Tr6 receiving a control signal HIN. Putting the control signal HIN in the high level causes the transistor Tr3 to be off, regardless of the level of the input signal IN.

FIG. 8 is a circuit diagram for a seventh embodiment of the present invention. This embodiment includes all features described in FIGS. 3 through 7. Even with this configuration, the number of elements used is as small as eleven, still providing a reduction in the chip size.

FIG. 9 is a circuit diagram for a application of this invention and more particularly the application of the FIG. 2 comparator to an igniter for the car spark plug. A capacitor Cl and an n-p-n transistor Tr7 are additionally connected in parallel between the emitter of the transistor Tr1 and the ground voltage GND in FIG. 2. An additional resistor R5 is also connected between the emitter of the transistor Tr1 and the supply voltage $V_{CC}$. When the base of the transistor Tr7 receives the input signal IN, then a charging wave form of VC1 appears at the node N1 as shown in FIG. 10. The signal voltage VC1 is sliced at the threshold voltages $Vth_{ON}$ and $Vth_{OFF}$, which produces the spark-plug ignition timing control pulse as the output OUT.

As described above, according to the present invention, it is possible to provide a comparator that allows simplification of the circuit while ensuring the essential function, which contributes to a reduction in the chip size.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A comparator circuit with a hysteresis, the comparator circuit being adapted for receiving a first potential and a second potential, the comparator circuit comprising:
   a first transistor of a first conductivity type, including
      a first end having at least one terminal,
      a second end having at least one terminal, and
      a first control terminal for controlling a current flow between the first and second ends;
   a second transistor of a second conductivity type, including
      a first end having at least one terminal,
      a second end having at least one terminal, and
      a second control terminal for controlling a current flow between the first and second ends, the first end of said first transistor being coupled to the second control terminal and the first end of said second transistor being coupled to the first control terminal between said first potential and said second potential so as to provide positive feedback;
   a first resistance element coupled between the second control terminal and said second potential;
   a second resistance element in a positive feedback path between the first control terminal and the first end of said second transistor; and
   a third transistor of the second conductivity type having a third control terminal coupled to the first end of said second transistor.

2. A comparator circuit according to claim 1, further including a third resistance element coupled between said first potential and the first control terminal.

3. A comparator circuit according to claim 1, further comprising means for compensating for variations in the characteristic of said first transistor with temperature.

4. A comparator circuit according to claim 1, further including a fourth transistor, in an emitter follower configuration, coupled between the second end of said first transistor and said first potential.

5. A comparator circuit according to claim 1, further including a fourth transistor, including
   a first end having at least one terminal, the first end being coupled to the control terminal of said second transistor,
   a second end having at least one terminal, the second end being coupled the second potential, and
   a fourth control terminal for controlling a current flow between the first and second ends.

6. A comparator circuit according to claim 1, further including a fourth transistor, including
   a first end having at least one terminal,
   a second end having at least one terminal, and
   a fourth control terminal for controlling a current flow between the first and second ends,
wherein the first and second ends of said fourth transistor are coupled in parallel with the first and second ends of said second transistor.

7. A comparator circuit according to claim 6, wherein the first end of said first transistor has a plurality of terminals, including a terminal connected to the first control terminal.

8. A comparator circuit adapted for receiving a potential, the comparator circuit comprising:
   a first transistor, of a first conductivity type, including
      a first end having at least one terminal,
      a second end having at least one terminal, and
      a first control terminal for controlling a current flow between the first and second ends;
   a second transistor of a second conductivity type, including
      a first end having at least one terminal, the first end being coupled to the first control terminal,
      a second end having at least one terminal, the second end being coupled to the potential, and
      a second control terminal for controlling a current flow between the first and second ends, the second control terminal being coupled to the first end of the first transistor;
   a first resistance element coupled between the second control terminal and the potential;
   a second resistance element coupled between the first control terminal and the potential; and
   a third transistor of the second conductivity type, including a third control terminal coupled to the first end of the second current path.

9. A comparator circuit according to claim 8, further including a third resistance element coupled between another potential and the first control terminal.

10. A comparator circuit according to claim 8, further including a fourth transistor, including
    a first end having at least one terminal, the first end being coupled to the second control terminal,
    a second end having at least one terminal, the second end being coupled to the potential, and
    a fourth control terminal for controlling a current flow between the first and second ends.

11. A comparator circuit according to claim 8, further including a fourth transistor, including
    a first end having at least one terminal,
    a second end having at least one terminal, and
    a fourth control terminal for controlling a current flow between the first and second ends,
wherein the first and second ends of said fourth transistor are coupled in parallel with the first and second ends of said second transistor.

12. A comparator circuit according to claim 8, wherein the first end of the first current path has a plurality of terminals, including a terminal coupled to the first control terminal.

13. A comparator circuit adapted for receiving a potential, the comparator circuit comprising:
    a first transistor, of a first conductivity type, including
       a first end having at least one terminal,
       a second end having at least one terminal, and
       a first control terminal for controlling a current flow between the first and second ends;
    a second transistor of a second conductivity type, including
       a first end having at least one terminal, the first end being coupled to the first control terminal,
       a second end having at least one terminal, the second end being coupled to the potential, and
       a second control terminal for controlling a current flow between the first and second ends, the second control terminal being coupled to the first end of the first transistor;
    a first resistance element coupled between the second control terminal and the potential;
    a second resistance element coupled between the first control terminal and the potential;
    a third resistance element coupled between another potential and the first control terminal;

a third transistor of the second conductivity type, including a third control terminal coupled to the first end of the second current path;

a fourth transistor including
- a first end having at least one terminal, the first end being coupled to the second end of said first transistor,
- a second end having at least one terminal, the second end being coupled to the potential, and
- a fourth control terminal for controlling a current flow between the first and second ends, the control terminal being coupled to the first end of the first transistor;

a capacitor coupled in parallel with the first and second ends of said fourth transistor; and a fourth resistance element coupled between the second end of said first transistor and another potential.

14. A comparator circuit with a hysteresis, the comparator circuit being adapted for receiving a first potential and a second potential, the comparator circuit comprising:

a first transistor of a first conductivity type, including
- a first collector means,
- a first emitter means, and
- a first base;

a second transistor of a second conductivity type, including
- a second collector means,
- a second emitter means, and
- a second base, the first collector means being coupled to the second base and the second collector means being coupled to the first base between the first potential and the second potential so as to provide positive feedback;

a first resistance element coupled between the second base and the second potential;

a second resistance element in a positive feedback path between the first base and the second collector means; and a third transistor of the second conductivity type having a third base coupled to the second collector means.

15. A comparator circuit according to claim 14, further including a third resistance element coupled between the first potential and the first base.

16. A comparator circuit according to claim 14, further including a fourth transistor, in an emitter means follower configuration, coupled between the first emitter means and the first potential.

17. A comparator circuit according to claim 14, further including a fourth transistor, including
- a fourth collector means coupled to the second base,
- a fourth emitter means coupled the second potential, and
- a fourth base for controlling a current flow between the fourth collector means and fourth emitter means.

18. A comparator circuit according to claim 14, further including a fourth transistor, including
- a fourth collector means,
- a fourth emitter means, and
- a fourth base for controlling a current flow between the fourth collector means and fourth emitter means, wherein the fourth collector means and fourth emitter means are coupled in parallel with the second collector means and second emitter means.

19. A comparator circuit according to claim 18, wherein the first collector means includes a plurality of collectors, including a collector connected to the first base.

20. A comparator circuit adapted for receiving a potential, the comparator circuit comprising:

a first transistor, of a first conductivity type, including
- a first collector means,
- a first emitter means, the first collector means and first emitter means defining a first current path, and
- a first base;

a second transistor of a second conductivity type, including
- a second collector means coupled to the first base,
- a second emitter means coupled to the potential, the second collector means and second emitter means defining a second current path coupled between the first base and the second potential, and
- a second base coupled to the first collector means;

a first resistance element coupled between the second base and the potential;

a second resistance element coupled between the first base and the potential; and a third transistor of the second conductivity type, including a third emitter means coupled to the second potential, and a third base coupled to the second current path.

21. A comparator circuit according to claim 20, further including a third resistance element coupled between the first potential and the first base.

22. A comparator circuit according to claim 20, further including a fourth transistor, including
- a fourth collector means coupled tot he second base,
- a fourth emitter means coupled to the potential, and
- a fourth base for controlling a current flow between the fourth collector means and fourth emitter means.

23. A comparator circuit according to claim 20, further including a fourth transistor, including
- a fourth collector means,
- a fourth emitter means, the fourth collector means and fourth emitter means defining a fourth current path, and
- a fourth base for controlling a current flow between the fourth collector means and fourth emitter means, wherein the fourth current path is coupled in parallel with the second current path.

24. A comparator circuit according to claim 20, wherein the first collector means includes a plurality of collectors, including a collector coupled to the first base.

25. A comparator circuit adapted for receiving a potential, the comparator circuit comprising:

a first transistor, of a first conductivity type, including
- a first collector means,
- a first emitter means, the first collector means and first emitter means defining a first current path, and
- a first base;

a second transistor of a second conductivity type, including
- a second collector means coupled to the first base, a second emitter means coupled to the potential, the second collector means and second emitter means defining a second current path coupled between the first base and the second potential, and a second base, coupled to the first collector means;

a first resistance element coupled between the second base and the potential;

a second resistance element coupled between the first base and the potential;

a third resistance element coupled between another potential and the first base;

a third transistor of the second conductivity type, including a third collector means, a third emitter means, the third collector means and a third emitter means defining a third current path, and third base coupled to the second current path;

a fourth transistor including
  a fourth collector means, the collector means being coupled to the emitter means of the first transistor,
  a fourth emitter means, the emitter means being coupled to the potential, the fourth collector means and fourth emitter means defining a fourth current path coupled between first emitter means and the second potential, and
  a fourth base, the base being coupled to the first collector means;

a capacitor coupled in parallel with the fourth current path; and a fourth resistance element coupled between the first emitter means and the first potential.

* * * * *